(12) United States Patent
Sun et al.

(10) Patent No.: US 9,485,084 B2
(45) Date of Patent: Nov. 1, 2016

(54) LINEARITY OF PHASE INTERPOLATORS BY COMBINING CURRENT CODING AND SIZE CODING

(71) Applicant: Qualcomm Incorporated, San Diego, CA (US)

(72) Inventors: Li Sun, San Diego, CA (US); Zhi Zhu, San Diego, CA (US); Xiaohua Kong, San Diego, CA (US); Kenneth Luis Arcudia, Cary, NC (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/300,127

(22) Filed: Jun. 9, 2014

(65) Prior Publication Data

US 2015/0358148 A1 Dec. 10, 2015

(51) Int. Cl.
*H04L 7/033* (2006.01)
*H03L 7/099* (2006.01)
*H03K 5/135* (2006.01)
*H03K 5/00* (2006.01)

(52) U.S. Cl.
CPC ............ *H04L 7/0331* (2013.01); *H03K 5/135* (2013.01); *H03L 7/099* (2013.01); *H03K 2005/00065* (2013.01)

(58) Field of Classification Search
USPC .......................................... 375/376, 373, 294
See application file for complete search history.

(56) References Cited

U.S. PATENT DOCUMENTS

| | | | |
|---|---|---|---|
| 6,133,773 A * | 10/2000 | Garlepp et al. ............... | 327/247 |
| 7,180,352 B2 | 2/2007 | Mooney | |
| 7,750,707 B2 | 7/2010 | Momtaz | |
| 7,961,025 B2 | 6/2011 | Rylov | |
| 7,994,837 B1 | 8/2011 | Ho | |
| 8,384,458 B1 | 2/2013 | Huang | |
| 2004/0052323 A1 | 3/2004 | Zhang | |
| 2006/0055430 A1* | 3/2006 | Pickering et al. ............ | 327/2 |
| 2006/0220719 A1 | 10/2006 | Freyman et al. | |
| 2010/0026367 A1 | 2/2010 | Jiang | |

FOREIGN PATENT DOCUMENTS

EP 1351398 A1 10/2003

OTHER PUBLICATIONS

International Search Report and Written Opinion—PCT/US2015/030644—ISA/EPO—Aug. 13, 2015.

* cited by examiner

*Primary Examiner* — Kabir A Timory
(74) *Attorney, Agent, or Firm* — Procopio, Cory, Hargreaves & Savitch LLC

(57) ABSTRACT

A phase interpolator, including: a first portion including a first plurality of branches and a plurality of tail current sources, each branch including a differential pair of transistors, source terminals of the differential pair of transistors connect to form a source node, wherein each tail current source couples to one of the source nodes, and wherein the differential pair of transistors and the corresponding tail current source are configured in a current coding scheme; a second portion including a second plurality of branches and a fixed current source coupled to the second plurality of branches, each branch of the second plurality of branches including a second plurality of differential pairs of transistors and a plurality of switches configured in a size coding scheme; wherein the first portion and the second portion are coupled to each other and to a pair of load resistors.

13 Claims, 9 Drawing Sheets

LINEARITY OF PHASE INTERPOLATORS BY COMBINING CURRENT CODING AND SIZE CODING

BACKGROUND

1. Field

This invention relates to phase interpolators, and more specifically, to improving the linearity of the phase interpolators by combining the current coding scheme and the size coding scheme.

2. Background

A receiver needs to determine when to sample the data signal transmitted from one chip to another or from one core to another within a single chip. The receiver determines this using a clock signal sent with the data signal. However, in systems with higher signal rates or no explicit clock signal present, the receiver requires a clock alignment circuit such as a phase-locked loop (PLL). A phase interpolator-based clock data recovery circuit (CDR) is an alternative system that can generate precisely-aligned clocks by selecting pairs of reference phases and interpolating between them to recover the data from the serialized data signal.

One of the most commonly used CDR architectures is a dual-loop structure consisting of a cascade of two loops, a core PLL and a peripheral CDR loop. A PLL generates multiple phases, which are used by the phase interpolator in the CDR loop to introduce a controlled phase shift in the recovered clock. The negative feedback of the CDR loop forces the recovered clock phase to the middle of the received data.

Although the simplicity of the CDR architecture has led to its widespread usage, one of the disadvantages of this architecture includes excessive clock jitter due to nonlinearity of the phase interpolator. In one example, the nonlinearity of the phase interpolator is illustrated in a representative transfer function shown in FIG. 1. Ideally, the minimum phase step is equal to $\phi_{LSB}$, but interpolator nonlinearity introduces a much larger phase jump, $\phi_{MAX}$, that severely degrades the recovered clock jitter. Differential nonlinearity (DNL) is often used to measure the deviation from the ideal step width.

SUMMARY

The present invention provides for improving the linearity of the phase interpolator by combining the current coding scheme and the size coding scheme.

In one embodiment, a phase interpolator is disclosed. The phase interpolator includes: a pair of load resistors coupled to a supply voltage; a first portion including a first plurality of branches and a plurality of tail current sources, each branch of the first plurality of branches including a differential pair of transistors, source terminals of the differential pair of transistors connect to form a source node, wherein each tail current source of a plurality of tail current sources couples to one of the source nodes, and wherein the differential pair of transistors and the corresponding tail current source are configured in a current coding scheme; a second portion including a second plurality of branches and a fixed current source coupled to the second plurality of branches, each branch of the second plurality of branches including a second plurality of differential pairs of transistors and a plurality of switches configured in a size coding scheme; wherein the first portion and the second portion are coupled to each other and to the pair of load resistors.

In another embodiment, a method for improving linearity of a phase interpolator by combining a current coding scheme and a size coding scheme is disclosed. The method includes: receiving a plurality of differential input signals at a corresponding plurality of branches, the corresponding plurality of branches comprising a first portion configured in the current coding scheme and a second portion configured in the size coding scheme, and each differential input signal having an assigned phase, each branch of the first portion: comprising a differential pair of source-coupled transistors, wherein source terminals of the source-coupled transistors are connected to form a source node; interpolating between the assigned phases of the plurality of differential input signals by controlling an amount of current flowing through the source node of said each branch; each branch of the second portion: comprising a plurality of differential pairs of transistors and a plurality of switches; interpolating between the assigned phases of the plurality of differential input signals by controlling a number of the plurality of differential pairs of transistors turned on by the corresponding plurality of switches; and coupling the first portion to the second portion.

In another embodiment, an apparatus for improving linearity of a phase interpolator by combining a current coding scheme and a size coding scheme is disclosed. The apparatus includes: means for receiving a plurality of differential input signals at a corresponding plurality of branches, the corresponding plurality of branches comprising a first portion configured in the current coding scheme and a second portion configured in the size coding scheme, and each differential input signal having an assigned phase, each branch of the first portion: comprising a differential pair of source-coupled transistors, wherein source terminals of the source-coupled transistors are connected to form a source node; means for interpolating between the assigned phases of the plurality of differential input signals by controlling an amount of current flowing through the source node of said each branch; each branch of the second portion: comprising a plurality of differential pairs of transistors and a plurality of switches; means for interpolating between the assigned phases of the plurality of differential input signals by controlling a number of the plurality of differential pairs of transistors turned on by the corresponding plurality of switches; and means for coupling the first portion to the second portion.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

As stated above, although the simplicity of the phase interpolator-based clock data recovery (CDR) circuit has led to its widespread usage, one of the disadvantages of this architecture includes excessive clock jitter due to nonlinearity of the phase interpolator within the CDR.

Certain embodiments as described herein provide for improving the linearity of the phase interpolator by combining the current coding scheme and the size coding scheme. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

A phase interpolator or phase rotator receives a plurality of differential input signals of different phases and interpolates between the phases to produce a differential output signal having a desired phase. In generating a clock signal, the phase of the signal is adjusted so that the transition of the clock signal occurs near the middle of the data signal ("eye") when data is not transitioning.

Figure 1:
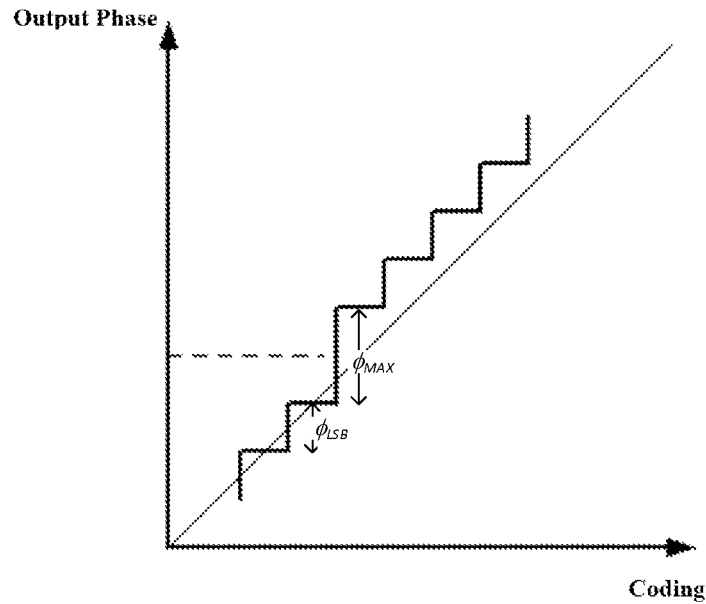
FIG. 1 illustrates a nonlinearity of a phase interpolator in a representative transfer function.
Figure 2:
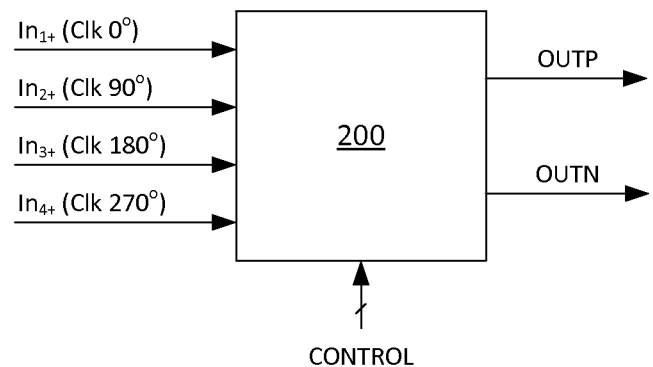
FIG. 2 is a functional block diagram showing a typical phase interpolator with four input signals ($In_{1+}$, $In_{2+}$, $In_{3+}$, $In_{4+}$) that are 90 degrees out of phase with each other.

FIG. 2 is a functional block diagram showing a typical phase interpolator 200 with four input signals ($In_{1+}$, $In_{2+}$, $In_{3+}$, $In_{4+}$) that are 90 degrees out of phase with each other. Typically, the signals are assumed to be sinusoidal. Thus, if $In_{1+}$ signal (Clk 0°) is represented as $\sin(\omega t)$, then $In_{2+}$ signal (Clk 90°) is represented as $\cos(\omega t)$, $In_{3+}$ signal (Clk 180°) is represented as $-\sin(\omega t)$, and $In_{4+}$ signal (Clk 270°) is represented as $-\cos(\omega t)$.

Figure 3:
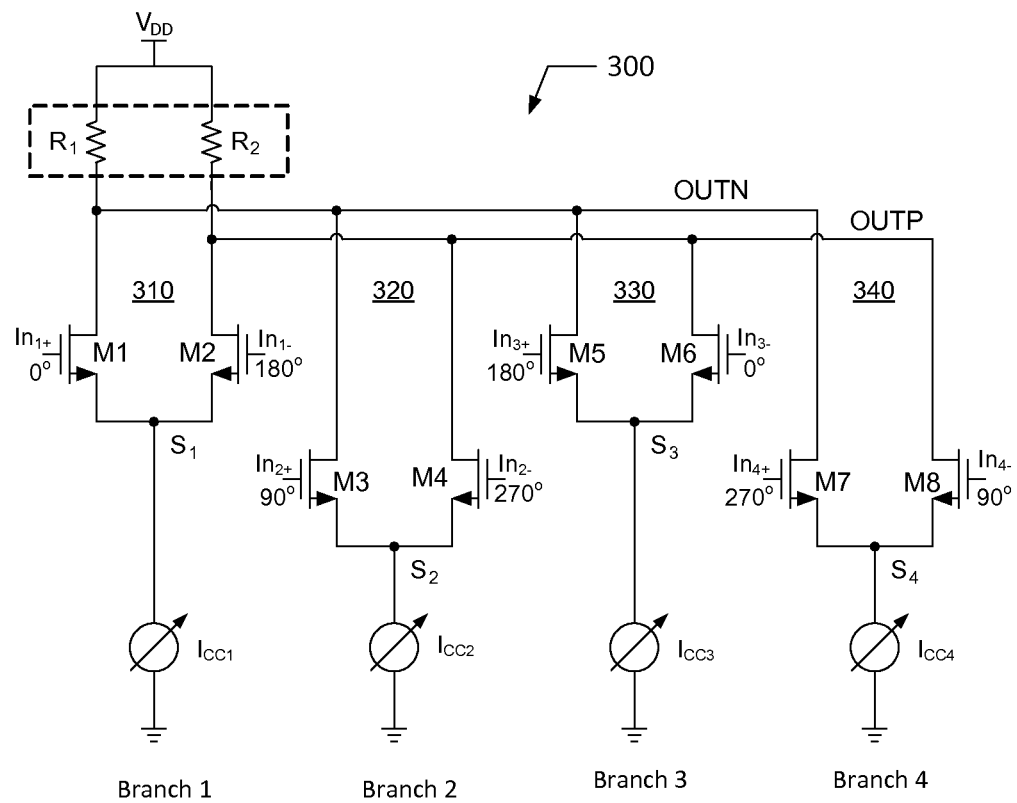
FIG. 3 is a schematic diagram of a phase interpolator configured in a current coding scheme in accordance with one embodiment.

FIG. 3 is a detailed schematic diagram of a phase interpolator 300 configured in a current coding scheme in accordance with one embodiment. In the illustrated embodiment of FIG. 3, the phase interpolator 300 includes two load resistors $R_1$ and $R_2$ and four branches 310, 320, 330, 340. Each branch includes a differential pair of source-coupled transistors receiving differential input signals.

The first branch 310 includes a differential pair of source-coupled transistors M1, M2 receiving differential input signals $In_{1+}$ and $In_{1-}$ that are 180 degrees out of phase. The drain terminal of transistor M1 connects to the supply voltage ($V_{DD}$) through $R_1$ and the drain terminal of transistor M2 connects to $V_{DD}$ through $R_2$. The first branch 310 also includes a tail current source ($I_{cc1}$). The second branch 320 includes a differential pair of source-coupled transistors M3, M4 receiving differential input signals $In_{2+}$ and $In_{2-}$ that are 180 degrees out of phase. As noted above, input signal $In_{2+}$ (Clk 90°) is 90 degrees out of phase with $In_{1+}$ (Clk 0°). Thus, the phase interpolator 300 uses the first and second branches to interpolate between phase 0° and 90° of input signals $In_{1+}$ and $In_{2+}$. The drain terminal of transistor M3 connects to the supply voltage ($V_{DD}$) through $R_1$ and the drain terminal of transistor M4 connects to $V_{DD}$ through $R_2$. The second branch 320 also includes a tail current source ($I_{cc2}$). The third branch 330 includes a differential pair of source-coupled transistors M5, M6 receiving differential input signals $In_{3+}$ and $In_{3-}$ that are 180 degrees out of phase. As noted above, input signal $In_{3+}$ (Clk 180°) is 90 degrees out of phase with $In_{2+}$ (Clk 90°). Thus, the phase interpolator 300 uses the second and third branches to interpolate between phase 90° and 180° of input signals $In_{2+}$ and $In_{3+}$. The drain terminal of transistor M5 connects to the supply voltage ($V_{DD}$) through $R_1$ and the drain terminal of transistor M6 connects to $V_{DD}$ through $R_2$. The third branch 330 also includes a tail current source ($I_{cc3}$). The fourth branch 340 includes a differential pair of source-coupled transistors M7, M8 receiving differential input signals $In_{4+}$ and $In_{4-}$ that are 180 degrees out of phase. As noted above, input signal $In_{4+}$ (Clk 270°) is 90 degrees out of phase with $In_{3+}$ (Clk180°). Thus, the phase interpolator 300 uses the third and fourth branches to interpolate between phase 180° and 270° of input signals $In_{3+}$ and $In_{4+}$. The phase interpolator 300 uses the fourth and first branches to interpolate between phase 270° and 360° (i.e., 0°) of input signals $In_{4+}$ and $In_{1+}$. The drain terminal of transistor M7 connects to the supply voltage ($V_{DD}$) through $R_1$ and the drain terminal of transistor M8 connects to $V_{DD}$ through $R_2$. The fourth branch 340 also includes a tail current source ($I_{cc4}$).

In current-steering digital-to-analog converters (DACs), switches are used to route current into resistors or current sensors. Typically, the switches are driven by a binary digital value which is converted to an analog value. When the binary digital values are changed, some switches may need to be opened and others switches may need to be closed. However, the transitions of the switches may cause a mismatch between the time for the closing switches to close and the time for the opening switches to open. In some situations, this may cause glitches at the output as the values are resolved and stabilized. Thus, in one embodiment, a total current flowing through each of the two load resistors is controlled using thermometer coding in which the number of ones in the code adds up to the number counted to avoid the above-described glitch problem using binary coding. For example, in thermometer coding, number 1 is represented as '000001', number 2, is represented as '000011', number 3 is represented as '000111', and so on. Thus, in thermometer coding, when the digital value changes, the changing switches are either all opening or all closing. For example, when the digital value changes from 1 to 3, the switch for the LSB stays in the same position, while the switches for the second and third LSB closes with no switches that need to be opened. When the digital value changes from 3 to 1, switches for second and third LSB opens with no switches that need to be closed. Therefore, the thermometer coding provides a simple and effective way to control switches in high-speed applications.

The thermometer codes are set in such a way that the total current flowing through each of the two load resistors $R_1$ and $R_2$ is always constant ($n*I_{unit}/2$) regardless of how the tail currents are divided. For example, if all the current flows through the first branch 310, the output phase is 0 degree. If all the current draws through the second branch 320, output phase is 90 degrees. If an output phase between 0 and 90 degrees is desired, the total current ($n*I_{unit}$) is distributed between the first branch 310 and the second branch 320. In this case, no current flows through the third branch 330 and/or the fourth branch 340. Accordingly, if the desired output phase is between 0 and 90, the current distribution will be between Branches 1 and 2. If the desired output phase is between 90 and 180, the current distribution will be between Branches 2 and 3. If the desired output phase is between 180 and 270, the current distribution will be between Branches 3 and 4. If the desired output phase is between 270 and 0, the current distribution will be between Branches 4 and 1. In general, for any output phase, the total current ($n*I_{unit}$) will only be distributed between two adjacent branches (in a circular context), wherein the first and last branches are considered to be adjacent. Thus, branches 1 and 2, branches 2 and 3, branches 3 and 4, and branches 4 and 1 are considered to be adjacent branches.

In one embodiment, the distribution ratio of the tail current is represented by variable x (where 0<x<1). For example, when the desired output phase is between 0 and 90 degrees, and the current flowing through the second branch 320 is x times the total current (i.e., $x*n*I_{unit}$), then the current flowing through the first branch 310 is equal to $(1-x)*n*I_{unit}$. Hence, x can be directly controlled using the thermometer code.

Figure 4:
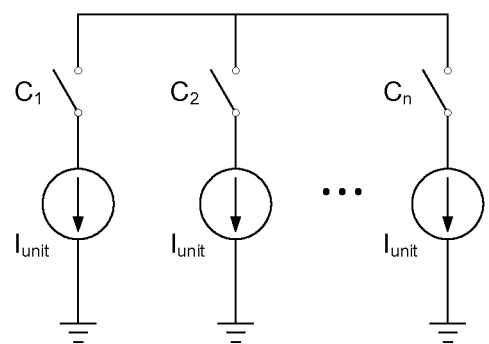
FIG. 4 is a tail current source configured as an n-bit current source with an n number of switches and unit current sources.

The phase interpolator 300 further includes two output terminals OUTP and OUTN which output differential signals that are separated by 180 degrees. Terminal OUTP outputs a signal with an output phase that is controlled by the distribution of tail current ($I_{cc}$) in the tail current source. In one embodiment, the tail current source is configured as an n-bit current source (shown in FIG. 4) with an n number of switches and unit current sources. The configuration of the switches provides an n-bit thermometer code. Thus, a total number of unit current sources switched on at any one time in all of the branches is equal to the total number of unit current sources in a single branch.

Accordingly, the output voltage at terminal OUTP can be expressed as follows:

$$V_{OUTP}=g_{m1}(x)R_1 \sin(\omega t)+g_{m2}(x)R_2 \cos(\omega t)=\text{Amp}(x)\sin(\omega t+\phi(x)) \quad (1)$$

where $g_{m1}$ and $g_{m2}$ are the transconductance of differential pairs in the first branch and the second branch, respectively, $R_1=R_2$ are load resistances, $\phi(x)$ is the output phase, and amp(x) is the amplitude of the output voltage. Thus, the linearity of the phase interpolator 300 can be defined as the linearity of $\phi(x)$.

The transconductance ($g_m(x)$) for the MOS transistor model can be derived as follows:

$$I(x) = \frac{1}{2}\mu_n C_{ox}\frac{W}{L}(V_{gs}-V_{th})^2 \quad (2)$$

$$g_m(x) = \sqrt{2I(x)\mu_n C_{ox}\frac{W}{L}} \quad (3)$$

wherein I(x) is the drain-to-source current, $\mu_n$ is the charge-carrier effective mobility, $C_{ox}$ is the capacitance of the gate oxide layer, W is the gate width, L is the gate length, $V_{gs}$ is the gate-to-source bias, and $V_{th}$ is the threshold voltage.

To simplify the derivation, $g_m$ is normalized as follows:

$$g_{m1}(0)=1, g_{m1}(1)=0 \quad (4)$$

$$g_{m2}(0)=0, g_{m2}(1)=1 \quad (5)$$

This normalization will not affect the output transfer function $\phi(x)$. Thus, the transconductances for the first branch ($g_{m1}(x)$) and the second branch ($g_{m2}(x)$) are as follows:

$$g_{m1}(x)=\sqrt{1-x} \quad (6)$$

$$g_{m2}(x)=\sqrt{x} \quad (7)$$

Accordingly, the output phase transfer function $\phi(x)$ for the current coding scheme is as follows:

$$\varphi_{\substack{current \\ coding}}(x) = \arcsin(\sqrt{x}) \quad (8)$$

Figure 5:
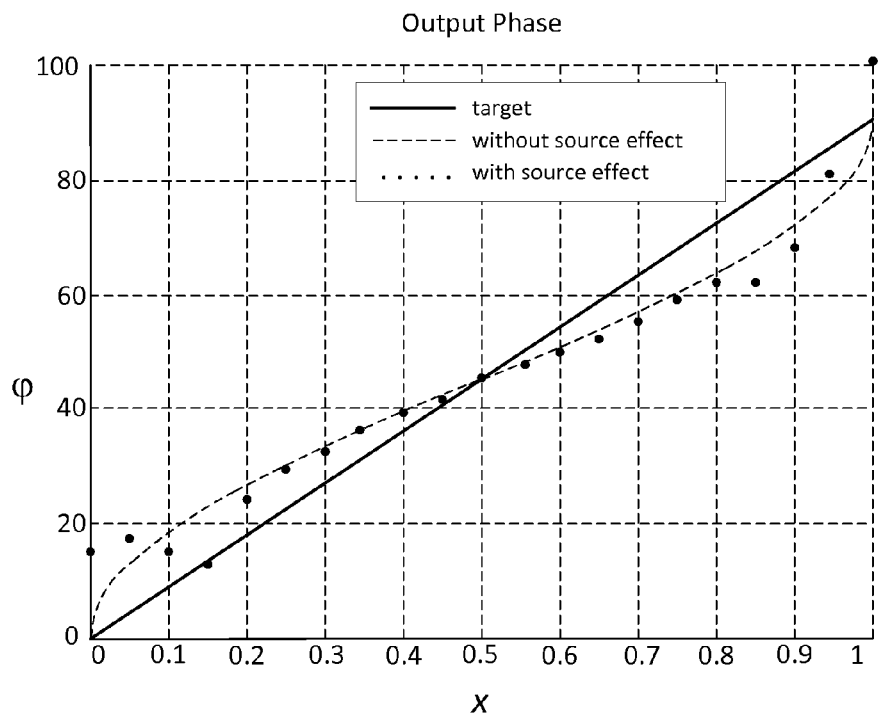
FIG. 5 illustrates the output phase transfer function for the current coding scheme.

This output phase transfer function for the current coding scheme is illustrated in FIG. 5 as the dashed curve. The solid line represents the ideal linear transfer function. However, the voltage fluctuation at four source nodes $S_1$ to $S_4$ (shown in FIG. 3) substantially affects the output phase (indicated as dots in FIG. 5) and degrades the linearity of the output phase. The phase output (dots) was simulated with following values for the input parameters: $\mu_n C_{ox}=800$ μA/0.06V$^2$, $R_1=R_2=1400$ ohms, I=400 μA, and input amplitude 100 mV. According to the graph shown in FIG. 5, the maximum DNL (equal to 1.57 LSB) without the source node effect (dashed curve) occurs at the first and last step with the phase error of about 8.85 degrees. However, with the source node effect, the maximum DNL (equal to 2.90 LSB) occurs at the last step with the phase error of about 16.5 degrees. Accordingly, there is a need to reduce the effects of the source nodes (i.e., nodes S1, S2, S3, S4 in FIG. 3) on the output phase.

Figure 6:
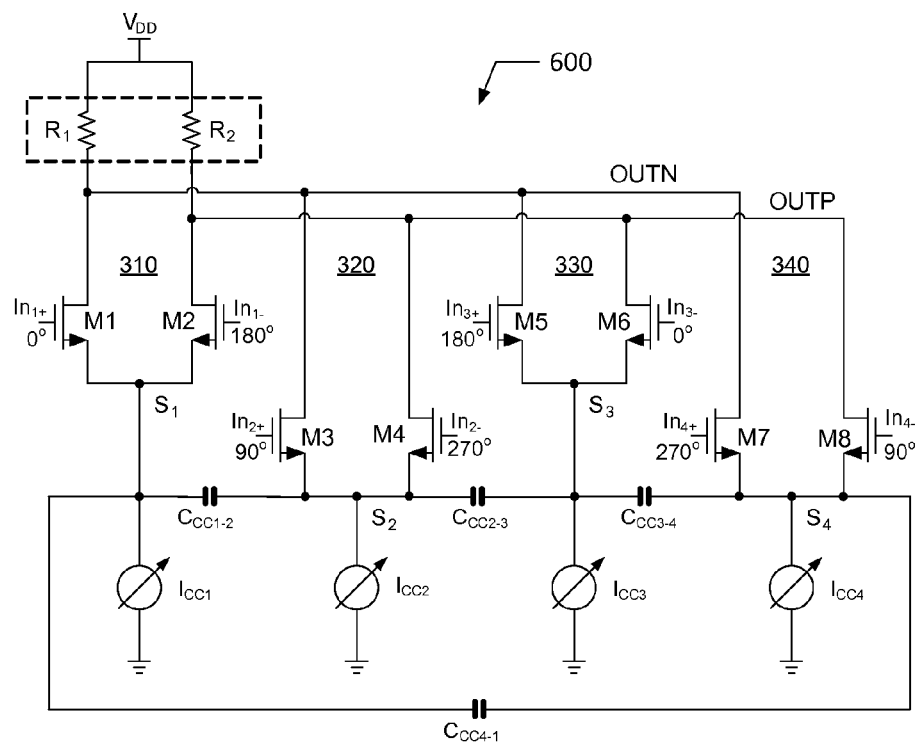
FIG. 6 is a schematic diagram of a phase interpolator configured in a current coding scheme using capacitive elements in accordance with one embodiment.

FIG. 6 is a schematic diagram of a phase interpolator 600 configured in a current coding scheme using capacitive elements in accordance with one embodiment. In the illustrated embodiment of FIG. 6, four coupling capacitors $C_{CC1-2}$, $C_{CC2-3}$, $C_{CC3-4}$, and $C_{CC4-1}$ are used to connect source nodes $S_1$ to $S_4$ of the differential pairs ($M_1$ to $M_8$) to reduce the voltage fluctuation at the source nodes (shown in FIG. 5) and thus reduce the degradation of the output phase linearity. Coupling capacitor $C_{CC1-2}$ is used to couple the source nodes of the first and second branches, coupling capacitor $C_{CC2-3}$ is used to couple the source nodes of the second and third branches, coupling capacitor $C_{CC3-4}$ is used to couple the source nodes of the third and fourth branches, and coupling capacitor $C_{CC4-1}$ is used to couple the source nodes of the fourth and first branches. The value of the coupling capacitors is selected to be comparable to the gate-to-source capacitance of the differential pair of transistors. In one embodiment, the value of each coupling capacitor is selected to be about equal to each other (i.e., $C_{CC1-2} \approx C_{CC2-3} \approx C_{CC3-4} \approx C_{CC4-1}$). Further, the range of value for the coupling capacitor depends on the CMOS technology, which should be about 10 to 50 femto-Farads for greater than 65-nm CMOS technology, which is very small compared to normal bypass capacitances.

Figure 7:
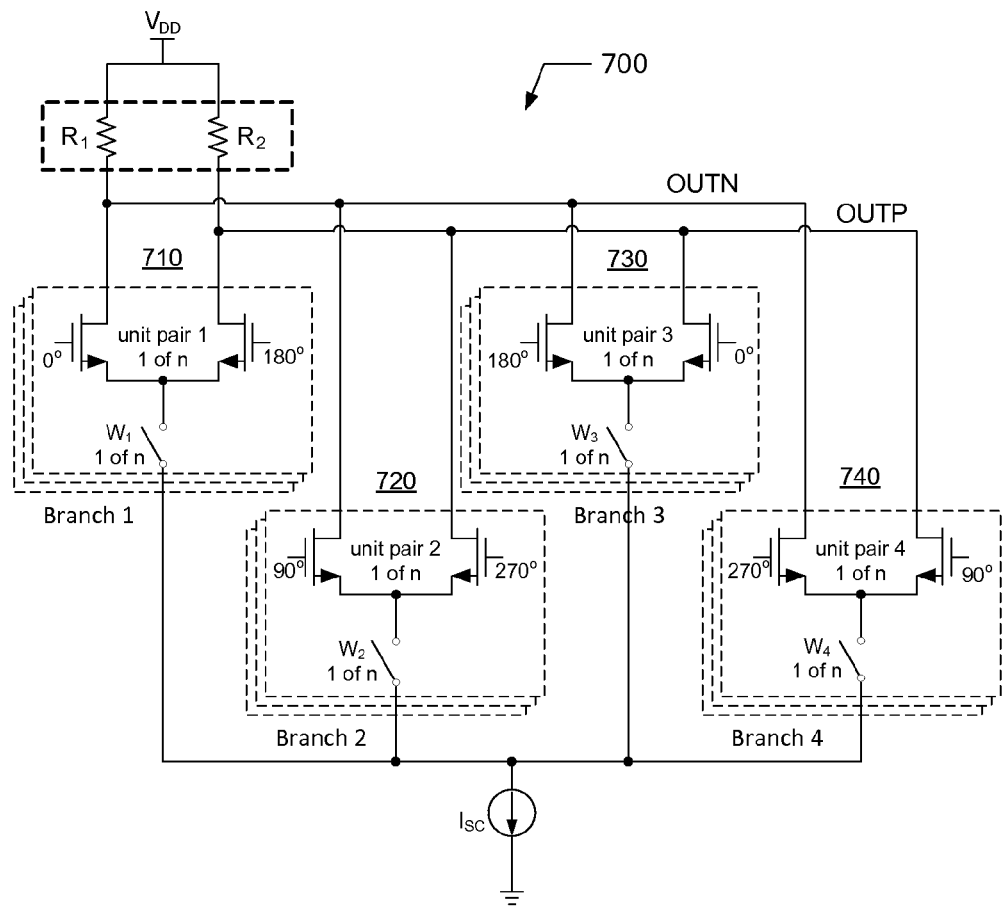
FIG. 7 is a schematic diagram of a phase interpolator configured in a size coding scheme in accordance with one embodiment.

FIG. 7 is a schematic diagram of a phase interpolator 700 configured in a size coding scheme in accordance with one embodiment. In the illustrated embodiment of FIG. 7, the phase interpolator 700 includes two load resistors $R_1$ and $R_2$ and four branches, similar to the phase interpolator 300 configured in a current coding scheme shown in FIG. 3. However, unlike the phase interpolator 300 configured in a current coding scheme, the tail current ($I_{SC}$) in the size coding scheme is fixed and coupled to all branches. Further, unlike the phase interpolator 300 configured in a current coding scheme, each differential pair of source-coupled transistors in each branch is configured with n differential pairs of transistors that are turned on or off using a set of n switches.

Figure 8:
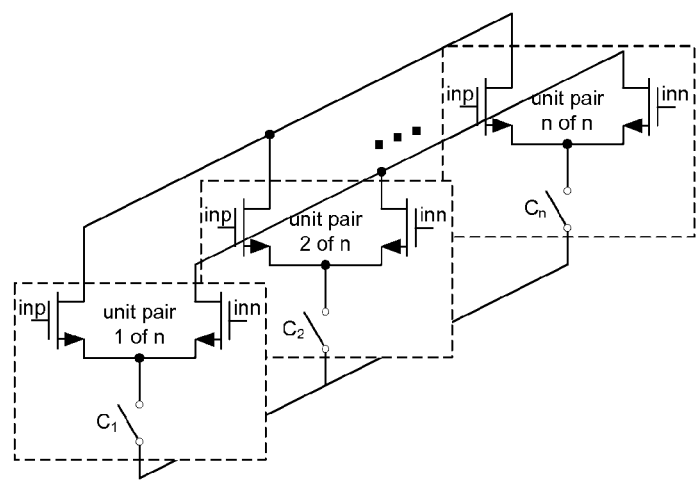
FIG. 8 is a schematic diagram of one branch including a set of n switches that are used to turn on or off n differential pairs of transistors, in accordance with one embodiment.

For example, FIG. 8 is a schematic diagram of one branch including n differential pairs of transistors that are turned on or off using a set of n switches, in accordance with one embodiment. In the illustrated embodiment of FIG. 8, switch $C_1$ is used to turn on or off the first differential pair of transistors, switch $C_2$ is used to turn on or off the second differential pair of transistors, and so on, until switch $C_n$ is used to turn on or off the $n^{th}$ differential pair of transistors. Thus, switches in each branch can be controlled by the same thermometer code for $C_1$ to $C_n$ as those in the current coding scheme illustrated in FIG. 3. Accordingly, the size-coded phase interpolator 700 selects the output phase (and the current) by controlling the number of differential pairs of transistors turned on or off, which determines the size of the differential pairs of each branch. Thus, a total number of switches turned on at any one time in all of the branches is equal to the total number of switches (n) in a single branch.

Figure 9:
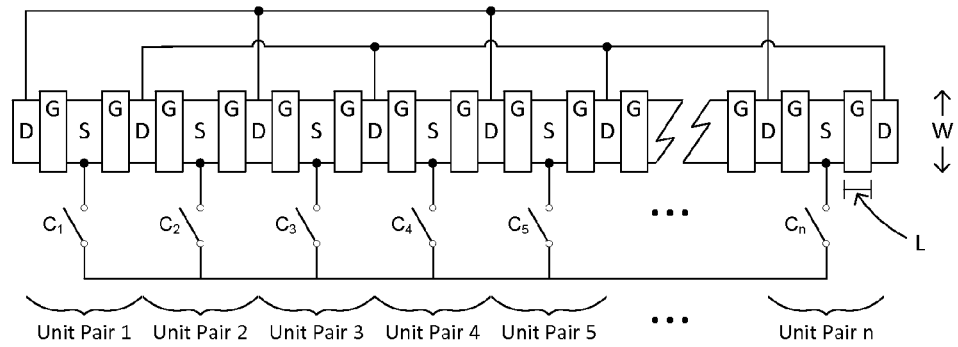
FIG. 9 is a schematic layout of one branch illustrated in FIG. 8 in accordance with one embodiment.

FIG. 9 is a schematic layout of the one branch illustrated in FIG. 8 in accordance with one embodiment. In the illustrated embodiment of FIG. 9, the n differential pairs of transistors are configured with gate, source, and drain terminals laid out on a substrate. Thus, each differential pair has the same dimension. Labels W and L represent the gate width and the gate length, respectively.

Referring to thermometer codes used to control switches $C_1$ to $C_n$, the thermometer codes are configured such that the number of differential pairs turned on remains constant (n) regardless of how the tail currents are divided into different branches. For example, if all the differential pairs of the first branch 710 are turned on, the output phase is 0 degrees. If all the differential pairs of the second branch 720 are turned on, the output phase is 90 degrees. If an output phase between 0 and 90 degrees is desired, both the first branch 710 and the second branch 720 will have a certain number of differential pairs turned on. In this case, no differential pairs in the third branch 730 and the fourth branch 740 will be turned on. In general, for any output phase, the differential pairs of transistors in two adjacent branches (i.e., branches 1 and 2; branches 2 and 3; branches 3 and 4; branches 4 and 1) are turned on. The first and last branches are also considered to be adjacent.

In one embodiment, the distribution ratio of the differential pairs of transistors turned on or off for the two adjacent branches is represented by variable x (where 0<x<1). For example, when the desired output phase is between 0 and 90 degrees, and the number of turned-on differential pairs in the second branch 720 is x times the total number of differential pairs (i.e., x*n), then the number of turned-on differential pairs in the first branch 710 is equal to (1−x)*n. Hence, x can be directly controlled using the thermometer code.

The transconductance ($g_m(x)$) of the MOS transistor model for the size coding scheme can be derived similarly to the current coding scheme, but for the size coding scheme, the term W/L is also a function of x as follows:

$$g_m(x) = \sqrt{2I(x)\mu_n C_{ox} \frac{W}{L}(x)} \qquad (9)$$

Again, $g_m$ is normalized as follows:

$$g_{m1}(0)=1, g_{m1}(1)=0 \qquad (10)$$

$$g_{m2}(0)=0, g_{m2}(1)=0 \qquad (11)$$

Thus, the transconductances of the first branch ($g_{m1}(x)$) and the second branch ($g_{m2}(x)$) for the size coding scheme are derived as follows:

$$g_{m1}(x)=1-x \qquad (12)$$

$$g_{m2}(x)=x \qquad (13)$$

Again, the output voltage at terminal OUTP can be expressed as follows:

$$V_{OUTP}=g_{m1}(x)R_1 \sin(\omega t)+g_{m2}(x)R_2 \cos(\omega t)=\text{Amp}(x) \sin(\omega t+\phi(x)) \qquad (14)$$

However, variables $g_{m1}(x)$ and $g_{m2}(x)$ represent the total transconductance of the differential pairs of transistors in the first branch and the second branch, respectively.

Accordingly, the output phase transfer function $\phi(x)$ for the size coding scheme is as follows:

$$\varphi_{\substack{size \\ coding}}(x) = \arcsin\left(\frac{x}{\sqrt{(1-x)^2 + x^2}}\right) \qquad (15)$$

Figure 10:
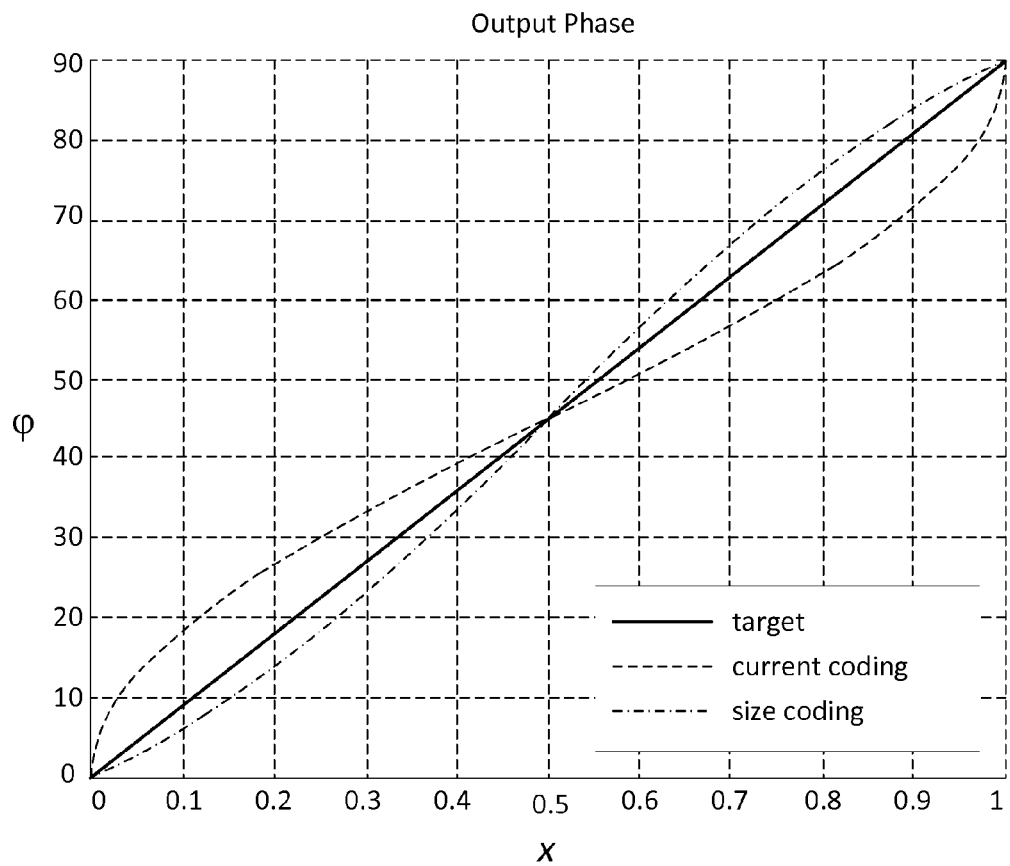
FIG. 10 is a phase transfer function plotting the output phase for the ideal linear case (solid line), the current coding scheme (dashed line), and the size coding scheme (dashed-dotted line)

FIG. 10 is a phase transfer function plotting the output phase for the ideal linear case (solid line), the current coding scheme (dashed line), and the size coding scheme (dashed-dotted line). According to the plot shown in FIG. 10 for the current coding mode, the maximum DNL (equal to 1.57 LSB) occurs at the first and last step with the phase error of about 9.50 degrees, while for the size coding mode, the maximum DNL (equal to 0.32 LSB) occurs at the first and last step with the phase error of about 4.10 degrees. Although the size coding improves the linearity, its minimum DNL cannot be less than 0.32 LSB due to mathematical limitations. Further, the output phase of the current coding scheme and the size coding scheme has opposite polarity. Accordingly, combining the two schemes with a fixed weight (K) results in higher linearity for the combined phase interpolator compared to either of the current coding scheme or size coding scheme phase interpolator.

Figure 11:
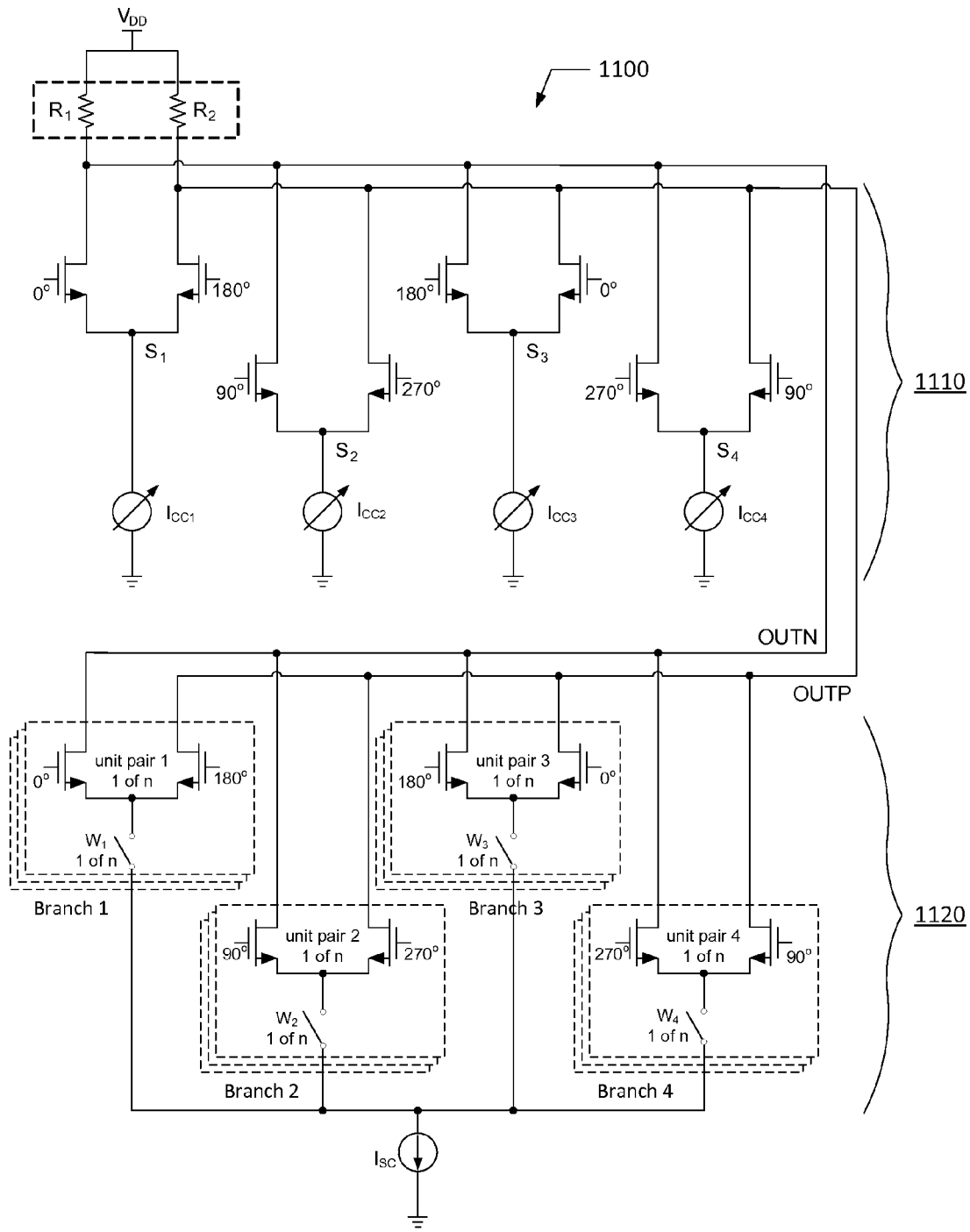
FIG. 11 is a schematic diagram of a phase interpolator configured in a combined scheme combining the current coding scheme with the size coding scheme in accordance with one embodiment.

FIG. 11 is a schematic diagram of a phase interpolator 1100 configured in a combined scheme combining the current coding scheme with the size coding scheme in accordance with one embodiment. In the illustrated embodiment of FIG. 11, the current coding branch 1110 and the size coding branch 1120 are summed at two load resistors $R_1$ and $R_2$. Weighting factor K represents the ratio of the two branches with respect to the total size and the current. The equation representing the ratio is shown below:

$$\left(\frac{W}{L}\right)_{CC} = K * n * \left(\frac{W}{L}\right)_{SC\_unit} \quad (16)$$

$$I_{CC1} = I_{CC2} = I_{CC3} = I_{CC4} = K * I_{SC} \quad (17)$$

The output voltage at terminal OUTP for the combined scheme phase interpolator can be expressed as follows:

$$v_{OUT}(t) = C[K\sqrt{1-x} \sin(\omega t) + K\sqrt{x} \cos(\omega t) + (1-x)\sin(\omega t) + x \cos(\omega t)] \quad (18)$$

wherein C is a constant.

Accordingly, the output phase transfer function φ(x) for the combined scheme is as follows:

$$\varphi_{combine}(x) = \arcsin\left(\frac{K\sqrt{x} + x}{\sqrt{\left(K\sqrt{x}+x\right)^2 + \left(K\sqrt{1-x}+1-x\right)^2}}\right) \quad (19)$$

Figure 12:
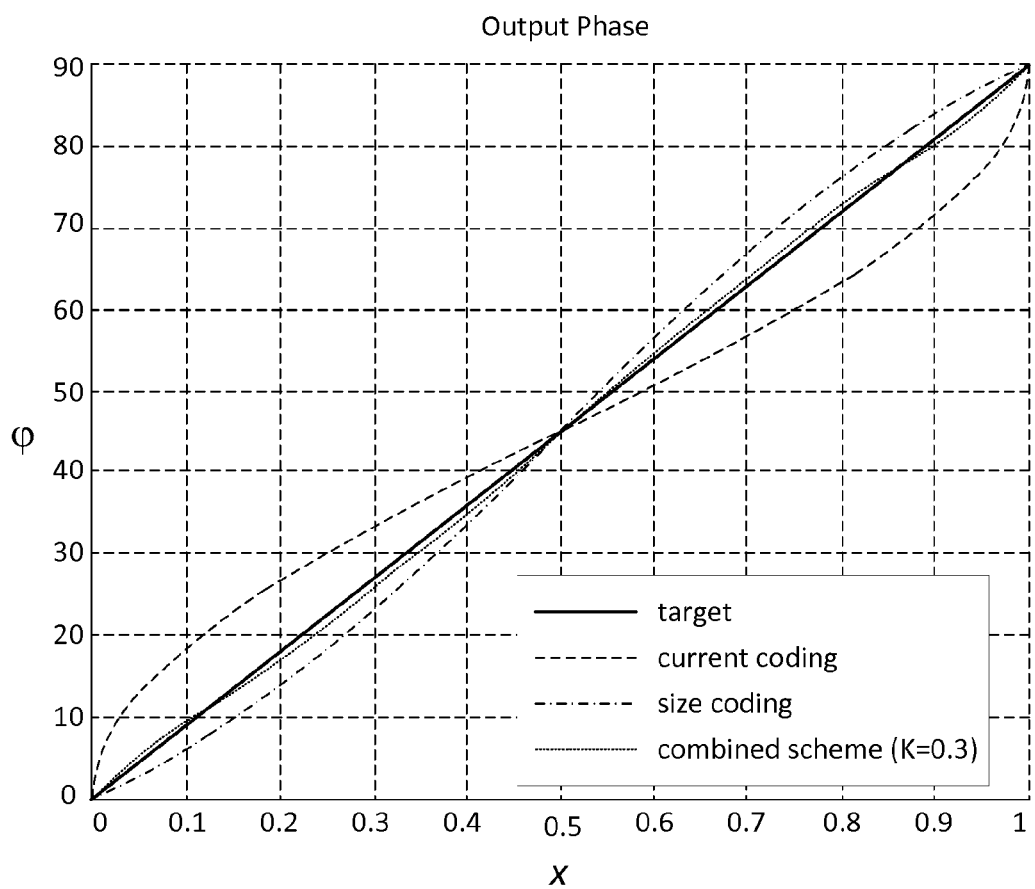
FIG. 12 is a phase transfer function showing the plot of the output phase for the ideal linear case (solid line), the current coding scheme (dashed line), the size coding scheme (dashed-dotted line), and the combined scheme (dotted line)

FIG. 12 is a phase transfer function showing the plot of the output phase for the ideal linear case (solid line), the current coding scheme (dashed line), the size coding scheme (dashed-dotted line), and the combined scheme (dotted line). The combined scheme was plotted with K=0.3 as the optimal weight ratio.

Figure 13A:
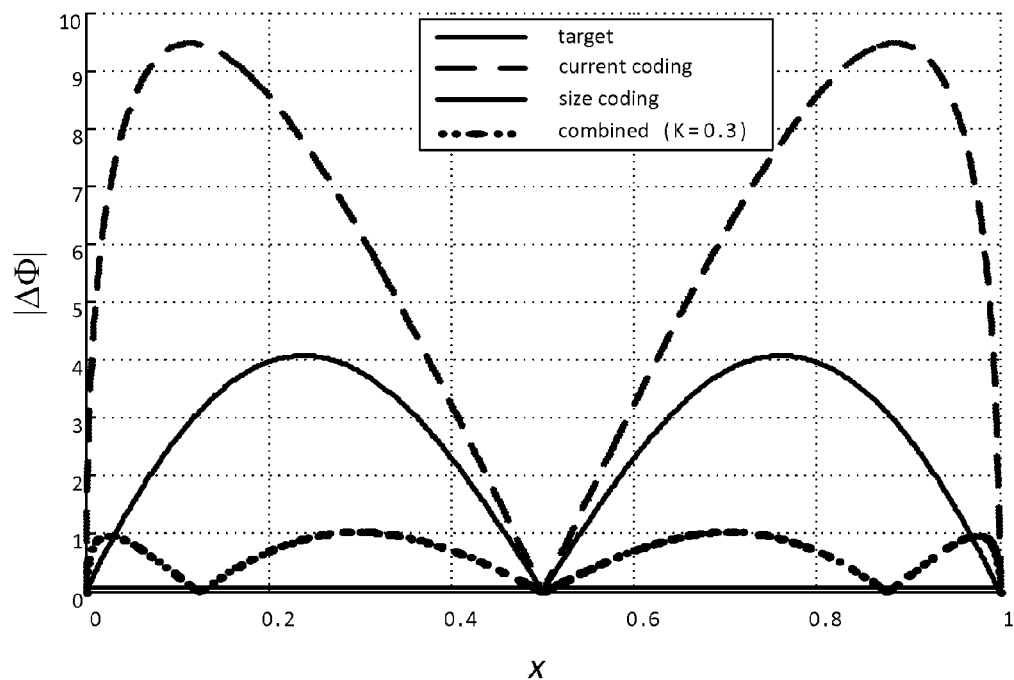
FIG. 13A is a plot of the absolute value of the phase error for different coding schemes including the ideal target case (solid straight line), the current coding scheme (dashed line), the size coding scheme (solid curve), and the combined scheme (dotted line)

FIG. 13A is a plot of the absolute value of the phase error for different coding schemes including the ideal target case (solid straight line), the current coding scheme (dashed line), the size coding scheme (solid curve), and the combined scheme (dotted line). In the plot of FIG. 13, the maximum phase error of the combined method (dotted line) is about 1.0 degree, which is an improvement from the size coding scheme by about 76% (which has a maximum phase error of about 4.1 degrees) and from the current coding scheme by about 90% (which has a maximum phase error is about 9.5 degrees).

Figure 13B:
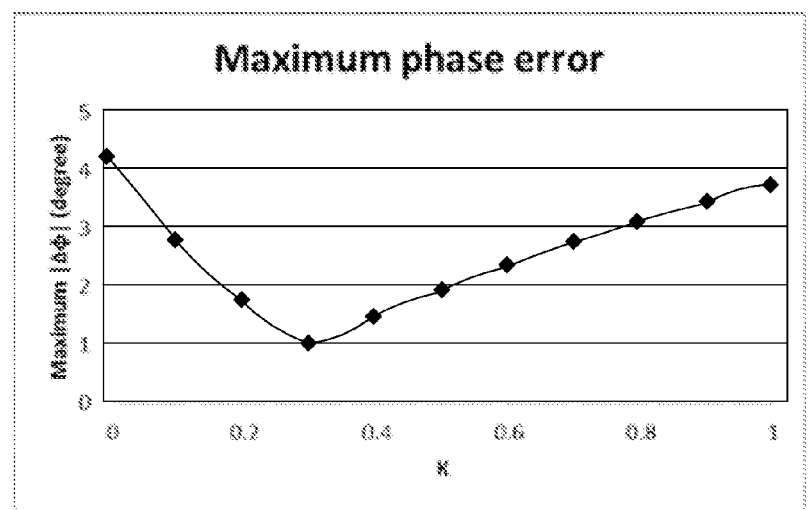
FIG. 13B is a plot of the maximum phase error with changes of factor K.

FIG. 13B is a plot of the maximum phase error with changes of factor K. In the illustrated plot of FIG. 13B, K=0 corresponds to the size-coding configuration, K->∞ is the current coding configuration, and K=0.3 is the optimal point with the maximum phase error being the lowest at that value. Table 1 illustrates values for the maximum phase error (in degrees) for various values of factor K.

TABLE 1

| K | Max Phase Error (Degrees) |
|---|---|
| 0.0 | 4.075 |
| 0.1 | 2.773 |
| 0.2 | 1.759 |
| 0.3 | 1.011 |
| 0.4 | 1.475 |
| 0.5 | 1.925 |
| 0.6 | 2.348 |
| 0.7 | 2.740 |
| 0.8 | 3.099 |
| 0.9 | 3.428 |
| 1.0 | 3.729 |
| 4.0 | 7.222 |
| 10.0 | 8.462 |
| 100.0 | 9.364 |

Figure 14:
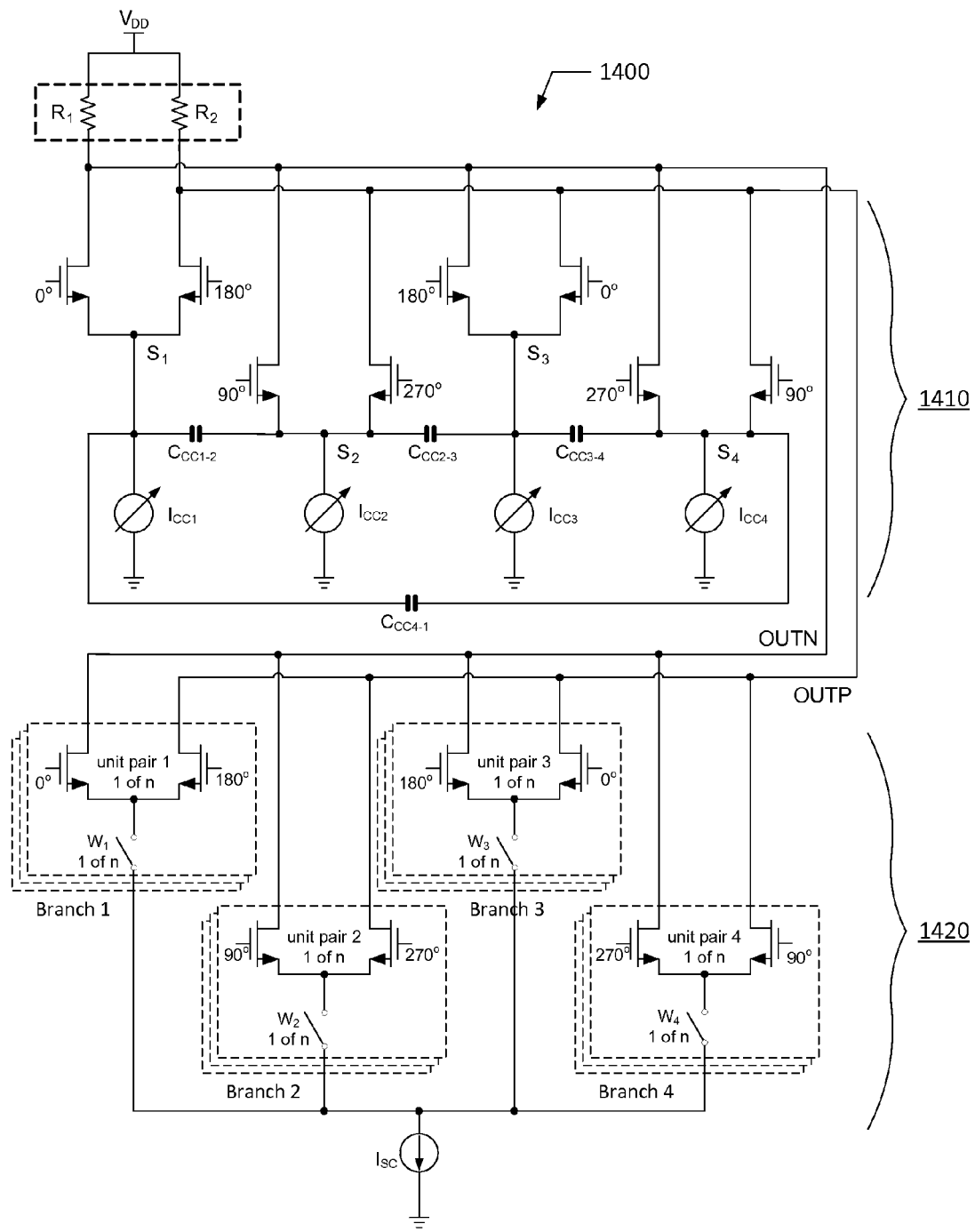
FIG. 14 is a schematic diagram of a phase interpolator configured in a combined scheme combining the current coding scheme using capacitive elements with the size coding scheme in accordance with another embodiment.

FIG. 14 is a schematic diagram of a phase interpolator 1400 configured in a combined scheme combining the current coding scheme using capacitive elements with the size coding scheme in accordance with another embodiment. In the illustrated embodiment of FIG. 14, the current coding branch 1410 includes four coupling capacitors $C_{CC1\text{-}2}$, $C_{CC2\text{-}3}$, $C_{CC3\text{-}4}$, and $C_{CC4\text{-}1}$ that are used to connect source nodes $S_1$ to $S_4$ of the differential pairs ($M_1$ to $M_8$) to reduce the voltage fluctuation at the source nodes and thus reduce the degradation of the output phase linearity. The size coding branch 1420 is configured same as the size coding branch 1120 in FIG. 11.

Although several embodiments of the invention are described above, many variations of the invention are possible. For example, although the illustrated embodiments describe a phase interpolator with four input signals that are 90 degrees out of phase with each other, other embodiments are possible. For example, a phase interpolator could have eight input signals that 45 degrees out of phase with each other. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A phase interpolator, comprising:
a pair of load resistors coupled to a supply voltage;
a first portion including a first plurality of branches, a plurality of tail current sources, and a plurality of source nodes, each branch of the first plurality of branches including a differential pair of transistors and a different one of the tail current sources of the plurality of tail current sources, wherein source terminals of differential pairs of transistors connect to form the plurality of source nodes,
wherein each tail current source of the plurality of tail current sources couples to one of the plurality of source nodes, and
wherein the differential pair of transistors and the plurality of tail current sources are configured in a current coding scheme;
a second portion including a second plurality of branches and a fixed current source coupled to the second plurality of branches, each branch of the second plurality of branches including a second plurality of differential pairs of transistors and a plurality of switches configured in a size coding scheme,
wherein each switch of the plurality of switches is coupled to and used to turn on or off a corresponding differential pair of transistors of the second plurality of differential pairs of transistors,
wherein the second plurality of differential pairs of transistors in said each branch of the second plurality of branches receives differential input signals with a particular phase that results from equally dividing 360 degrees by a total number of the second plurality of branches, and
wherein switches in two adjacent branches of the second plurality of branches are turned on to produce differential output signals having a desired phase between particular phases of the two adjacent branches;
wherein the first portion and the second portion are coupled to each other and to the pair of load resistors.

2. The phase interpolator of claim 1, wherein a total number of switches turned on at any one time in all of the second plurality of branches is equal to the total number of switches in a single branch of the second plurality of branches.

3. The phase interpolator of claim 1, wherein a number of the plurality of switches turned on in each of the two adjacent branches is proportional to how close the desired phase is to any one of the particular phases of the two adjacent branches.

4. The phase interpolator of claim 1, further comprising a plurality of coupling capacitors, each coupling capacitor coupled between source nodes in two adjacent branches of the first plurality of branches.

5. The phase interpolator of claim 1, wherein the first portion and the second portion are coupled to each other and to the pair of load resistors at drain terminals of differential pairs of transistors in the first plurality of branches and drain terminals of the differential pairs of transistors in the second plurality of branches.

6. A method for improving linearity of a phase interpolator by combining a current coding scheme and a size coding scheme, comprising:
receiving a plurality of differential input signals at a corresponding plurality of branches, the corresponding plurality of branches comprising a first portion configured in the current coding scheme and a second portion configured in the size coding scheme, and each differential input signal having an assigned phase,
each branch of the first portion:
comprising a differential pair of source-coupled transistors, wherein source terminals of the differential pair of source-coupled transistors are connected to form a source node;
interpolating between assigned phases of the plurality of differential input signals by controlling an amount of current flowing through the source node of said each branch;
each branch of the second portion:
comprising a plurality of differential pairs of transistors and a plurality of switches;
interpolating between the assigned phases of the plurality of differential input signals by controlling a number of the plurality of differential pairs of transistors turned on by the plurality of switches, which comprises turning on or off a differential pair of transistor in the second portion using a corresponding switch of the plurality of switches coupled to the differential pair of transistors in the second portion,
wherein the assigned phase of each differential input signal in each of the first portion and the second portion is assigned by equally dividing 360 degree by a total number of the plurality of branches in each of the first portion and the second portion,
wherein for the plurality of branches of the first portion, the unit current sources are switched in two adjacent branches to produce a pair of differential output signals having a desired phase between the assigned phases of the two adjacent branches,
wherein for the plurality of branches of the second portion, the plurality of switches of two adjacent branches are turned on to produce a pair of differential output signals having a desired phase between the assigned phases of the two adjacent branches; and
coupling the first portion to the second portion.

7. The method of claim 6, a total number of switches turned on at any one time in all of the plurality of branches in the second portion is equal to the total number of switches in a single branch of the second portion.

8. The method of claim 6, wherein a number of the plurality of switches turned on in each of the two adjacent branches in the second portion is proportional to how close the desired phase is to any one of the particular phases of the two adjacent branches.

9. The method of claim 6, further comprising
coupling capacitance between the source nodes of a pair of adjacent branches in the first portion.

10. An apparatus for improving linearity of a phase interpolator by combining a current coding scheme and a size coding scheme, the apparatus comprising:
means for receiving a plurality of differential input signals at a corresponding plurality of branches, the corresponding plurality of branches comprising a first portion configured in the current coding scheme and a second portion configured in the size coding scheme, and each differential input signal having an assigned phase, each branch of the first portion:
comprising a differential pair of source-coupled transistors, wherein source terminals of the differential pair of source-coupled transistors are connected to form a source node;
means for interpolating between assigned phases of the plurality of differential input signals by controlling an amount of current flowing through the source node of said each branch;
each branch of the second portion:
comprising a plurality of differential pairs of transistors and a plurality of switches;
means for interpolating between the assigned phases of the plurality of differential input signals by controlling a number of the plurality of differential pairs of transistors turned on by the corresponding plurality of switches, which comprises means for turning on or off a differential pair of transistors in the second portion using a corresponding switch of the plurality of switches coupled to the differential pair of transistors in the second portion,
wherein the assigned phase of each differential input signal in each of the first portion and the second portion is assigned by equally dividing 360 degrees by a total number of the plurality of branches in each of the first portion and the second portion,
wherein for the plurality of branches of the first portion, the unit current sources are switched in two adjacent branches to produce a pair of differential output signals having a desired phase between the assigned phases of the two adjacent branches,
wherein for the plurality of branches of the second portion, the plurality of switches of two adjacent branches are turned on to produce a pair of differential output signals having a desired phase between the assigned phases of the two adjacent branches; and
means for coupling the first portion to the second portion.

11. The apparatus of claim 10, a total number of switches turned on at any one time in all of the plurality of branches in the second portion is equal to the total number of switches in a single branch of the second portion.

12. The apparatus of claim 10, wherein a number of the plurality of switches turned on in each of the two adjacent branches in the second portion is proportional to how close the desired phase is to any one of the particular phases of the two adjacent branches.

13. The apparatus of claim 10, further comprising
means for coupling capacitance between the source nodes of a pair of adjacent branches in the first portion.

* * * * *